(12) United States Patent
Feng et al.

(10) Patent No.: US 11,908,226 B2
(45) Date of Patent: Feb. 20, 2024

(54) TEXTURE RECOGNITION DEVICE AND MANUFACTURING METHOD THEREOF

(71) Applicants: BEIJING BOE SENSOR TECHNOLOGY CO., LTD., Beijing (CN); BOE TECHNOLOGY GROUP CO., LTD., Beijing (CN)

(72) Inventors: Yajie Feng, Beijing (CN); Cheng Li, Beijing (CN); Yanna Xue, Beijing (CN); Xiaozhou Zhan, Beijing (CN); Yue Geng, Beijing (CN); Kuiyuan Wang, Beijing (CN); Haibo Huang, Beijing (CN); Jingfu Tao, Beijing (CN)

(73) Assignees: BEIJING BOE SENSOR TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 563 days.

(21) Appl. No.: 16/970,091

(22) PCT Filed: Nov. 28, 2019

(86) PCT No.: PCT/CN2019/121568
§ 371 (c)(1),
(2) Date: Aug. 14, 2020

(87) PCT Pub. No.: WO2021/042593
PCT Pub. Date: Mar. 11, 2021

(65) Prior Publication Data
US 2023/0025263 A1    Jan. 26, 2023

(51) Int. Cl.
*G06V 40/13*    (2022.01)
*G06V 40/12*    (2022.01)
(Continued)

(52) U.S. Cl.
CPC ....... *G06V 40/1318* (2022.01); *G02B 6/0068* (2013.01); *G02B 6/0073* (2013.01);
(Continued)

(58) Field of Classification Search
CPC .. G06V 10/147; G06V 10/54; G06V 40/1318; G06V 40/1324; G06V 40/1359;
(Continued)

(56) References Cited

U.S. PATENT DOCUMENTS

| 8,097,329 B2 | 1/2012 | Koshizuka |
| 9,501,686 B2 | 11/2016 | Lin |

(Continued)

FOREIGN PATENT DOCUMENTS

| CN | 101097914 A | 1/2008 |
| CN | 102036460 A | 4/2011 |

(Continued)

OTHER PUBLICATIONS

Extended European Search Report from European Patent Application No. 19944437.3 dated Jul. 13, 2022.
(Continued)

*Primary Examiner* — Premal R Patel
(74) *Attorney, Agent, or Firm* — Dilworth & Barrese, LLP.; Michael J. Musella, Esq.

(57) ABSTRACT

A texture recognition device and a manufacturing method thereof are provided. The texture recognition device includes a backlight component and a photosensitive component. The photosensitive component is on a light-outputting side of the backlight component and configured to detect light emitted by the backlight component and reflected by a texture of a detection object to recognize an image of the texture of the detection object. The photosensitive component includes a plurality of photosensitive sensors and an antistatic layer on a side, away from the (Continued)

backlight component, of the plurality of photosensitive sensors, and orthographic projections of the plurality of photosensitive sensors on a plane where the antistatic layer is located are within the antistatic layer.

19 Claims, 5 Drawing Sheets

(51) Int. Cl.

| | | |
|---|---|---|
| G06V 10/147 | (2022.01) | |
| G06V 10/54 | (2022.01) | |
| F21V 8/00 | (2006.01) | |
| H01L 23/60 | (2006.01) | |
| H05K 9/00 | (2006.01) | |
| G02B 5/04 | (2006.01) | |
| G02B 5/28 | (2006.01) | |

(52) U.S. Cl.
CPC ............ *G06V 10/147* (2022.01); *G06V 10/54* (2022.01); *G06V 40/1324* (2022.01); *G06V 40/1359* (2022.01); *G06V 40/1376* (2022.01); *H01L 23/60* (2013.01); *H05K 9/0067* (2013.01); *G02B 5/04* (2013.01); *G02B 5/281* (2013.01); *G02B 5/285* (2013.01)

(58) Field of Classification Search
CPC .............. G06V 40/1376; G02B 6/0068; G02B 6/0073; G02B 5/04; G02B 5/281; G02B 5/285; H01L 23/60; H05K 9/0067; G02F 1/1335; G06F 3/042
See application file for complete search history.

(56) References Cited

U.S. PATENT DOCUMENTS

| | | | |
|---|---|---|---|
| 11,099,703 | B1* | 8/2021 | Chan ................... G06F 3/044 |
| 11,380,129 | B2 | 7/2022 | Tao et al. |
| 2004/0190761 | A1 | 9/2004 | Lee |
| 2006/0109682 | A1 | 5/2006 | Ko et al. |
| 2012/0321149 | A1 | 12/2012 | Carver et al. |
| 2016/0232397 | A1* | 8/2016 | Yu ....................... G06V 40/1324 |
| 2017/0192611 | A1* | 7/2017 | Yang ..................... G06F 1/3262 |
| 2018/0258401 | A1 | 9/2018 | Karanu et al. |
| 2018/0260602 | A1 | 9/2018 | He et al. |
| 2018/0358401 | A1 | 12/2018 | Lin et al. |
| 2019/0034686 | A1* | 1/2019 | Ling ....................... H10K 59/40 |
| 2019/0055375 | A1* | 2/2019 | Choi ................. H01L 27/14621 |
| 2019/0094593 | A1 | 3/2019 | Hasegawa et al. |
| 2019/0179488 | A1 | 6/2019 | Klenkler et al. |
| 2019/0180072 | A1* | 6/2019 | Fomani .............. G06V 40/1324 |
| 2019/0347462 | A1 | 11/2019 | Tseng et al. |
| 2020/0026898 | A1 | 1/2020 | Fan et al. |
| 2020/0081173 | A1* | 3/2020 | Tak ........................ H10K 59/38 |
| 2020/0293738 | A1 | 9/2020 | Zhang et al. |
| 2020/0348550 | A1 | 11/2020 | Wu et al. |
| 2020/0408982 | A1 | 12/2020 | Kallassi et al. |
| 2021/0035959 | A1 | 2/2021 | Yang et al. |
| 2021/0174053 | A1 | 6/2021 | Nam et al. |
| 2022/0173174 | A1* | 6/2022 | Hatsumi ................ H10K 59/65 |

FOREIGN PATENT DOCUMENTS

| | | |
|---|---|---|
| CN | 105205470 A | 12/2015 |
| CN | 105304656 A | 2/2016 |
| CN | 105550664 A | 5/2016 |
| CN | 107798278 A | 3/2018 |
| CN | 207264357 U | 4/2018 |
| CN | 108446683 A | 8/2018 |
| CN | 208569606 U | 3/2019 |
| CN | 109633959 A | 4/2019 |
| CN | 110032913 A | 7/2019 |
| CN | 110088768 A | 8/2019 |
| CN | 109683375 A | 6/2021 |
| KR | 10-0737733 B1 | 7/2007 |
| KR | 10-2016-0023180 A | 3/2016 |
| WO | 2014115957 A1 | 7/2014 |

OTHER PUBLICATIONS

Office Action from U.S. Appl. No. 17/748,752 dated Oct. 3, 2022.
First U.S. Office Action from U.S. Appl. No. 16/963,984 dated Nov. 26, 2021.

* cited by examiner

TEXTURE RECOGNITION DEVICE AND MANUFACTURING METHOD THEREOF

CROSS-REFERENCE TO RELATED APPLICATIONS

This application is a U.S. National Phase Entry of International Application No. PCT/CN2019/121568 filed on Nov. 28, 2019, designating the United States of America and claiming priority to International Patent Application No. PCT/CN2019/104349 filed on Sep. 4, 2019. The present application claims priority to and the benefit of the above-identified applications and the above-identified applications are incorporated by reference herein in their entirety.

TECHNICAL FIELD

Embodiments of the present disclosure relate to a texture recognition device and a manufacturing method thereof.

BACKGROUND

Because of the uniqueness of a skin texture, such as a fingerprint pattern or a palmprint pattern, texture recognition technology combined with optical imaging is gradually adopted by texture recognition devices for identity recognition. The texture recognition device may be used as an identity recognition device in airports, banks and other places, or may be combined with mobile terminals to provide identity verification, electronic payment and other functions for the mobile terminals. Therefore, how to design a more optimized texture recognition device is a focus problem attracting attention in this field.

SUMMARY

At least one embodiment of the present disclosure provides a texture recognition device, the texture recognition device comprises a backlight component and a photosensitive component, the photosensitive component is on a light-outputting side of the backlight component and configured to detect light emitted by the backlight component and reflected by a texture of a detection object to recognize an image of the texture of the detection object, the photosensitive component comprises a plurality of photosensitive sensors and an antistatic layer on a side, away from the backlight component, of the plurality of photosensitive sensors, and orthographic projections of the plurality of photosensitive sensors on a plane where the antistatic layer is located are within the antistatic layer.

For example, in the texture recognition device provided by at least one embodiment of the present disclosure, a thickness of the antistatic layer is in a range of 8 microns to 30 microns.

For example, in the texture recognition device provided by at least one embodiment of the present disclosure, a relative dielectric constant of the antistatic layer is in a range of 3 to 10; and a material of the antistatic layer comprises a resin material.

For example, in the texture recognition device provided by at least one embodiment of the present disclosure, the photosensitive component further comprises a light filter layer on a side, away from the plurality of photosensitive sensors, of the antistatic layer, and the light filter layer is configured to filter light with a wavelength of 580 nm to 1100 nm.

For example, in the texture recognition device provided by at least one embodiment of the present disclosure, a material of the light filter layer comprises a stack of at least one $SiO_2$ layer and at least one $Ti_3O_5$ layer or a stack of at least one $SiO_2$ layer and at least one $Ta_2O_5$ layer.

For example, in the texture recognition device provided by at least one embodiment of the present disclosure, a surface, away from the antistatic layer, of the light filter layer is configured as a texture touch surface.

For example, in the texture recognition device provided by at least one embodiment of the present disclosure, the backlight component comprises a surface light source and a light restriction layer, the light restriction layer is on a side, close to the photosensitive component, of the surface light source, and is configured to restrain light emitted from the surface light source to a direction perpendicular to a surface of the texture recognition device.

For example, in the texture recognition device provided by at least one embodiment of the present disclosure, the light restriction layer comprises a first prism structure, and the first prism structure is configured to collimate the light emitted from the surface light source to the direction perpendicular to the surface of the texture recognition device by refraction.

For example, in the texture recognition device provided by at least one embodiment of the present disclosure, one surface of the first prism structure comprises a plurality of prism-shaped protrusions that are in parallel, a main cross section of each of the prism-shaped protrusions is in a triangle shape, and an apex angle of the triangle shape is in a range of 40 degrees to 75 degrees.

For example, in the texture recognition device provided by at least one embodiment of the present disclosure, a surface, facing the surface light source, of the first prism structure comprises the plurality of prism-shaped protrusions that are in parallel.

For example, in the texture recognition device provided by at least one embodiment of the present disclosure, the light restriction layer further comprises a second prism structure on a side, away from the surface light source, of the first prism structure, and the second prism structure is configured to only transmit light with an included angle within 30 degrees from a normal direction of the second prism structure.

For example, in the texture recognition device provided by at least one embodiment of the present disclosure, one surface of the second prism structure comprises a plurality of prism-shaped protrusions that are in parallel, a main cross section of each of the prism-shaped protrusions of the second prism structure is in a trapezium shape, and a bottom angle of the trapezium shape is in a range of 60 degrees to 90 degrees.

For example, in the texture recognition device provided by at least one embodiment of the present disclosure, the surface light source comprises a light guide plate and at least one light emitting component on at least one side surface of the light guide plate, and light emitted by the at least one light emitting component enters the light guide plate from the at least one side surface and exits from a plate surface, facing the light restriction layer, of the light guide plate; or the surface light source comprises a light emitting component array, and light emitting component array comprises a plurality of light emitting components that are in a plurality of rows and a plurality of columns.

For example, in the texture recognition device provided by at least one embodiment of the present disclosure, each of the light emitting components comprises a cathode, an anode, a light emitting layer between the cathode and the anode, and a grounded pin connected to the cathode.

For example, the texture recognition device provided by at least one embodiment of the present disclosure further comprises: a drive circuit on a side, away from the photosensitive component, of the backlight component, in which the drive circuit is configured to drive the photosensitive component.

For example, in the texture recognition device provided by at least one embodiment of the present disclosure, the photosensitive component comprises a sense region and a peripheral region surrounding the sense region, and the plurality of photosensitive sensors are in an array in the sense region, the texture recognition device further comprises a plurality of readout integrated circuits, the plurality of readout integrated circuits are in the peripheral region and alternately distributed respectively on a first side of the sense region and a second side of the sense region, and the first side is opposite to the second side; the array of the plurality of photosensitive sensors comprises a plurality of sub-arrays, first ends of the plurality of readout integrated circuits are respectively electrically connected with the plurality of sub-arrays, and second ends of the plurality of readout integrated circuits are electrically connected with the drive circuit.

For example, the texture recognition device provided by at least one embodiment of the present disclosure further comprises at least one gate driver which is in the peripheral region and on a third side of the sense region, a first end of the at least one gate driver is electrically connected with the plurality of photosensitive sensors, and a second end of the at least one gate driver is electrically connected with the drive circuit.

For example, the texture recognition device provided by at least one embodiment of the present disclosure further comprises a circuit board, the at least one gate driver comprises two gate drivers, the circuit board is between the two gate drivers and in parallel with the two gate drivers on the third side, and the two gate drivers are electrically connected with the drive circuit through the circuit board.

For example, the texture recognition device provided by at least one embodiment of the present disclosure further comprises an opaque glue frame surrounding the sense region.

For example, in the texture recognition device provided by at least one embodiment of the present disclosure, the photosensitive component further comprises a light filter layer on a side, away from the plurality of photosensitive sensors, of the antistatic layer, and the light filter layer is configured to filter light with a wavelength of 580 nm to 1100 nm, the backlight component comprises a surface light source and a light restriction layer, the light restriction layer comprises a first prism structure and a second prism structure, the second prism structure is on a side, away from the surface light source, of the first prism structure, the first prism structure is configured to collimate light emitted from the surface light source to a direction perpendicular to a surface of the texture recognition device by refraction, and the second prism structure is configured to only transmit light with an included angle within 30 degrees from a normal direction of the second prism structure; the photosensitive component comprises a sense region and a peripheral region surrounding the sense region, and the plurality of photosensitive sensors are in an array in the sense region; the texture recognition device further comprises: a drive circuit on a side, away from the photosensitive component, of the backlight component, the drive circuit being used for driving the photosensitive component; a plurality of readout integrated circuits that are in the peripheral region and alternately distributed respectively on a first side of the sense region and a second side of the sense region, in which the first side is opposite to the second side; the array of the plurality of photosensitive sensors comprises a plurality of sub-arrays, first ends of the plurality of readout integrated circuits are respectively electrically connected with the plurality of sub-arrays, and second ends of the plurality of readout integrated circuits are electrically connected with the drive circuit; two gate drivers that are in the peripheral region and on a third side of the sense region; and a circuit board that is between the two gate drivers and in parallel with the two gate drivers on the third side, in which first ends of the two gate drivers are respectively electrically connected with the photosensitive sensors, and second ends of the two gate drivers are electrically connected with the drive circuit through the circuit board.

At least one embodiment of the present disclosure provides a manufacturing method of a texture recognition device, which comprises: providing a backlight component; providing a photosensitive component which is configured to detect light emitted by the backlight component and reflected by a texture of a detection object to recognize an image of the texture of the detection object, in which the photosensitive component comprises a plurality of photosensitive sensors and an antistatic layer on a side, away from the backlight component, of the plurality of photosensitive sensors, and orthographic projections of the plurality of photosensitive sensors on a plane where the antistatic layer is located are within the antistatic layer; and stacking the backlight component and the photosensitive component.

For example, in the manufacturing method of the texture recognition device provided by at least one embodiment of the present disclosure, providing the photosensitive component comprises: forming the plurality of photosensitive sensors on a substrate, and forming the antistatic layer on the plurality of photosensitive sensors by a coating method.

For example, in the manufacturing method of the texture recognition device provided by at least one embodiment of the present disclosure, providing the photosensitive component further comprises: forming a light filter layer on a side, away from the plurality of photosensitive sensors, of the antistatic layer by an evaporation method, wherein the light filter layer is configured to filter light with a wavelength in a predetermined range.

For example, the manufacturing method of the texture recognition device provided by at least one embodiment of the present disclosure further comprises: providing a drive circuit, and connecting the drive circuit on a side, away from the photosensitive component, of the backlight component.

BRIEF DESCRIPTION OF THE DRAWINGS

In order to clearly illustrate the technical solutions of the embodiments of the disclosure, the drawings of the embodiments will be briefly described in the following; it is obvious that the described drawings are only related to some embodiments of the disclosure and thus are not limitative to the disclosure.

DETAILED DESCRIPTION

Figure 1:
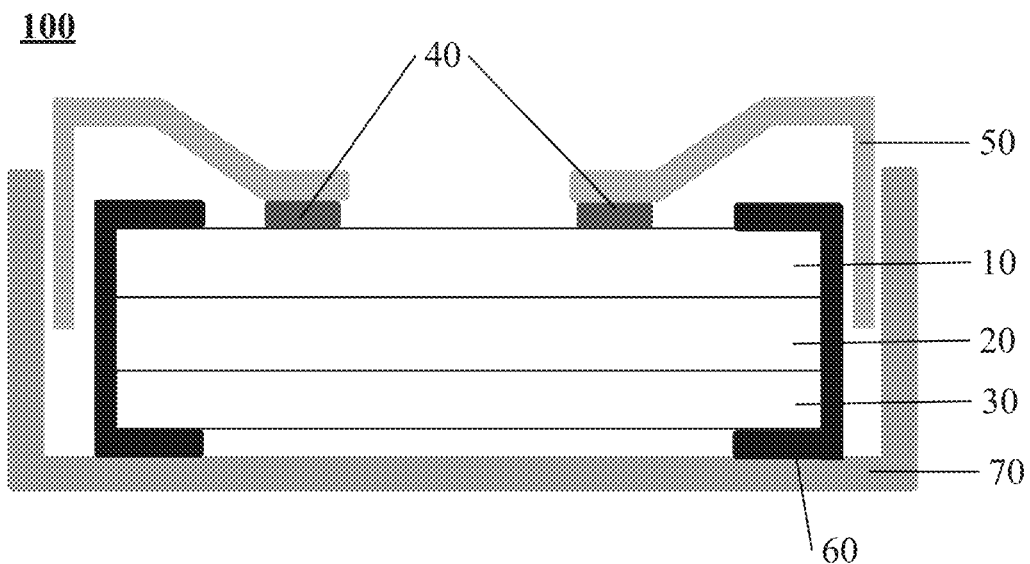
FIG. 1 is a schematic side view of a texture recognition device provided by at least one embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

In a texture recognition device combined with optical imaging, a photosensitive sensor is the key device to realize the collection and recognition of a fingerprint, the photosensitive sensor converts optical signals into electrical signals, and then realizes the collection and recognition of a texture. Because the photosensitive sensor mainly works utilizing light emitted by a backlight source of the texture recognition device, in this case, ambient light may interfere with the photosensitive sensor. In addition, when a texture of a detection object touches the texture recognition device, static electricity is easily generated, and the static electricity may interfere with normal operation of the photosensitive sensor, thus affecting the accuracy of texture recognition.

At least one embodiment of the present disclosure provides a texture recognition device, and the texture recognition device comprises a backlight component and a photosensitive component. The photosensitive component is on a light-outputting side of the backlight component and configured to detect light emitted by the backlight component and reflected by a texture of a detection object to recognize an image of the texture of the detection object. The photosensitive component comprises a plurality of photosensitive sensors and an antistatic layer on a side, away from the backlight component, of the plurality of photosensitive sensors, and orthographic projections of the plurality of photosensitive sensors on a plane where the antistatic layer is located are within the antistatic layer. The texture recognition device can effectively prevent static electricity generated when the texture of the detection object touches the texture recognition device from interfering with the photosensitive sensors.

In the following, the texture recognition device and the manufacturing method of the texture recognition device provided by embodiments of the present disclosure are described in detail with reference to the drawings.

Figure 2:
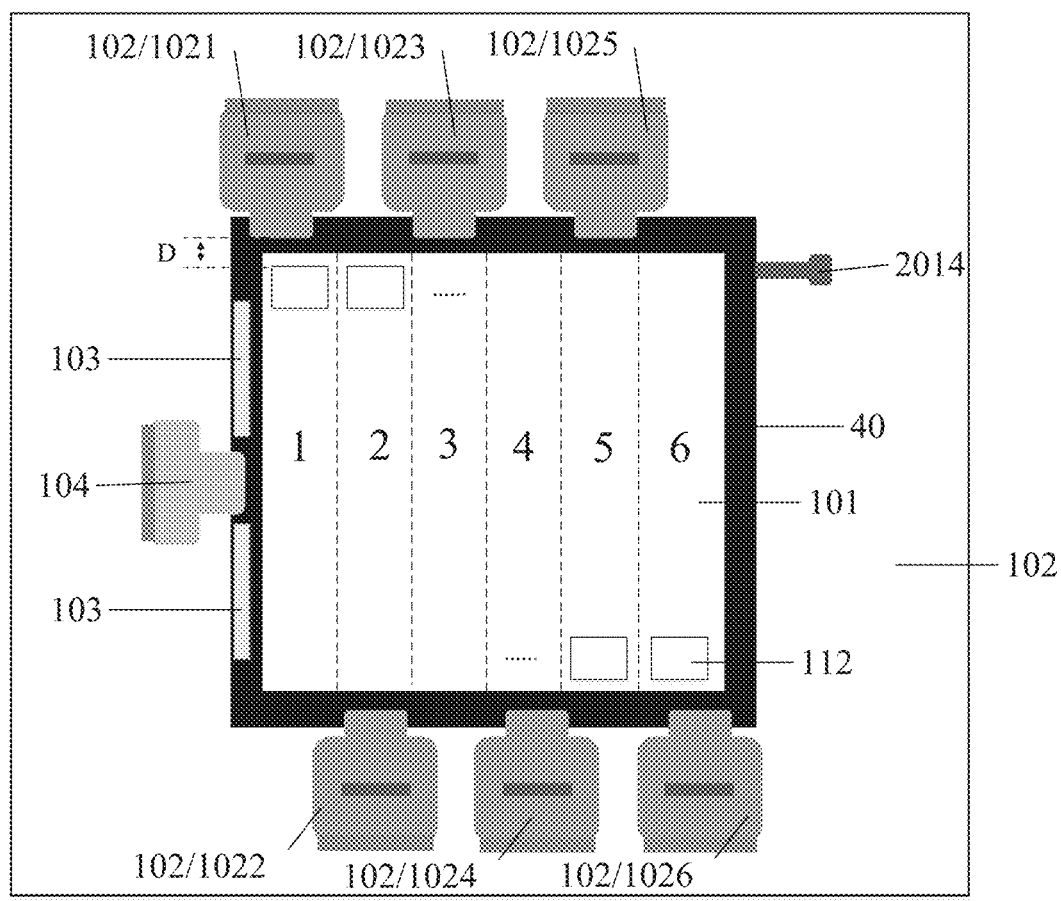
FIG. 2 is a partial schematic planar view of a texture recognition device provided by at least one embodiment of the present disclosure.

FIG. 1 is a schematic side view of a texture recognition device provided by at least one embodiment of the present disclosure; FIG. 2 is a partial schematic planar view of a texture recognition device provided by at least one embodiment of the present disclosure; and FIG. 3 is a schematic cross-sectional view of a photosensitive component in a texture recognition device provided by at least one embodiment of the present disclosure.

Figure 3:
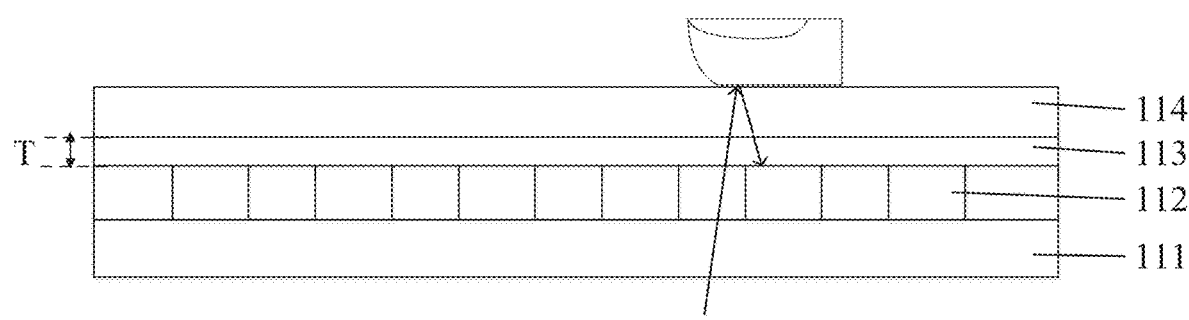
FIG. 3 is a schematic cross-sectional view of a photosensitive component in a texture recognition device provided by at least one embodiment of the present disclosure.

As illustrated in FIG. 1-FIG. 3, in at least one embodiment of the present disclosure, a texture recognition device 100 includes a backlight component 20 and a photosensitive component 10, and the photosensitive component 10 is configured to detect light emitted by the backlight component 20 and reflected by a texture of a detection object to recognize an image of the texture of the detection object. For example, the texture of the detection object includes a texture of a finger of the detection object or a texture of a palmprint of the detection object, and in this case, the texture recognized by the photosensitive component 10 is a skin texture, such as a fingerprint, a palmprint, etc. In addition, the texture of the detection object may also be a texture of a non-living object with a certain texture, such as a texture of a non-living object made of resin or other materials, and embodiments of the present disclosure do not specifically limit the texture of the detection object.

For example, in some embodiments, as illustrated in FIG. 3, the photosensitive component 10 is disposed on a light-outputting side of the backlight component 20, and includes a first substrate 111, a plurality of photosensitive sensors 112 on the first substrate 111, and an antistatic layer 113 on a side (i.e., the upper side illustrated in the figure), away from the backlight component 20, of the plurality of photosensitive sensors 112, and orthographic projections of the plurality of photosensitive sensors 112 on a plane where the antistatic layer 113 is located are within the antistatic layer 113, and thus the antistatic layer 113 covers the plurality of photosensitive sensors 112, so as to prevent static electricity generated when the texture of the detection object touches the texture recognition device 100 from interfering with the photosensitive sensors 112, and further improve the texture recognition accuracy realized by the texture recognition device 100.

For example, as illustrated in FIG. 2, the photosensitive component 10 includes a sense region 101 and a peripheral region 102 surrounding at least a part of (e.g., the entire) the sense region 101, the plurality of photosensitive sensors 112 are arranged in an array in the sense region 101, and drive components, signal lines, and the like for driving the photosensitive component 10 may be arranged in the peripheral region 102. As illustrated in FIG. 3, the light emitted by the backlight device 20 can reach the texture of an operator through gaps between adjacent photosensitive sensors 112, and then reflected to the photosensitive sensors 112 by the texture to be recognized.

For example, in some examples, the plurality of photosensitive sensors 112 are arranged in an array of 1600×1500 (i.e., 1600 rows and 1500 columns) in the sense region 101, thereby forming a texture recognition device with a resolution of 1600×1500. For example, in an example, a size of one pixel of a texture image formed by the texture recognition device is about 50.8 μm, so that the texture recognition device is a texture recognition device with high PPI (pixel per inch) and a large area, and can be used for recognizing large-area textures such as textures of four fingers or a large-area palmprint at the same time, for example, the texture recognition device can be applied to airports, banks and other places where identity verification is required, or combined with mobile terminals such as large-screen mobile phones, tablets and the like.

For example, in an example of the embodiment, the texture recognition device 100 may further include an opaque glue frame 40 surrounding the sense region 101, such as a dark (e.g., black, blue, etc.) glue frame, thereby defining the sense region 101. In this case, the texture of the detection object can be accurately pressed on the sense region 101. In addition, the opaque glue frame 40 can also play a role of light shielding to prevent light from entering the plurality of photosensitive sensors 112 from the periphery of the sense region 101, thereby reducing the interference caused by ambient light and improving the detection accuracy.

For example, in some embodiments, the antistatic layer 113 is formed as a whole surface on a side, away from the backlight component 20, of the plurality of photosensitive sensors 112. For example, an orthographic projection of the sense region 101 on the plane where the antistatic layer 113 is located is within the antistatic layer 113, so that the antistatic layer 113 as a whole covers the sense region 101 of the photosensitive component 10, and thus the antistatic layer 113 can provide a sufficient antistatic effect.

For example, in some embodiments, as illustrated in FIG. 3, a thickness T of the antistatic layer 113 is in a range of 8 microns to 30 microns, for example, 10 microns, 15 microns, 20 microns, or 25 microns. A relative dielectric constant of the antistatic layer 113 may be in a range of 3-10, for example, 5, 7 or 9. A material of the antistatic layer 113 may include a resin material (e.g., resin ink), such as an epoxy resin material. Therefore, the antistatic layer 113 can effectively prevent the static electricity generated when the texture of the detection object touches the texture recognition device 100 from interfering with the photosensitive sensors 112. For example, the light transmittance of the antistatic layer 113 is over 90%, and there are no scattering particles inside the antistatic layer 113 (i.e., the antistatic layer 113 is guaranteed to have a certain purity and does not contain impurities that can scatter light), so that the transmission of light used for the texture recognition is not affected.

For example, in some embodiments, as illustrated in FIG. 3, the photosensitive component 10 further includes a light filter layer 114 on a side, away from the plurality of photosensitive sensors 112, of the antistatic layer 113, and the light filter layer 114 is configured to filter light with a wavelength of 580 nm-1100 nm, that is, the light filter layer 114 does not allow the light with the wavelength of 580 nm-1100 nm to pass through, or light passing through the light filter layer 114 does not include the light with the wavelength of 580 nm-1100 nm.

Because there is blood circulating in the finger or palm of the detection object, light absorbed and reflected by hemoglobin in the blood is red with a wavelength of about 580 nm-1100 nm, and myoglobin in muscles of the finger or palm can also reflect red light. Therefore, in the case where the ambient light is strong, the ambient light can pass through the finger or palm, and the light passing through the finger or palm is red light with the wavelength of about 580 nm-1100 nm. In this case, the arrangement of the light filter layer 114 can effectively prevent the ambient light from entering the photosensitive sensors 112 and affecting the normal operation of the photosensitive sensors 112.

In addition, because a surface of the finger or palm has a horny layer, the light emitted by the backlight component 20 cannot enter the inside of the finger or palm, but can be reflected by the finger or palm, and therefore the light emitted by the backlight component 20 cannot be converted into red light by the finger or palm. Therefore, the light filter layer 114 can only filter the light with the wavelength of 580 nm-1100 nm generated when the ambient light passes through the finger or palm, while the light emitted by the backlight component 20 is not affected, and thus the filter layer 114 can effectively prevent the ambient light and does not affect the photosensitive sensors 112 to receive the light emitted by the backlight component 20 and then reflected by the finger or palm.

For example, in some embodiments, the light filter layer 114 includes a stack of a plurality of material layers. For example, in some embodiments, the light filter layer 114 includes a stack of at least one $SiO_2$ layer and at least one $Ti_3O_5$ layer, or a stack of at least one $SiO_2$ layer and at least one $Ta_2O_5$ layer.

Figure 4:
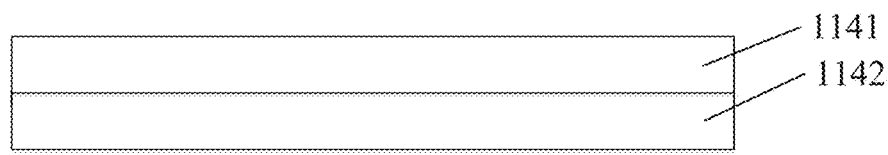
FIG. 4 is a schematic cross-sectional view of an antistatic layer of a texture recognition device provided by at least one embodiment of the present disclosure.

For example, FIG. 4 shows a stacked structure of the light filter layer 114. In this example, the light filter layer 114 includes a stacked structure of two material layers 1141 and 1142. For example, the two material layers 1141 and 1142 are respectively a $SiO_2$ layer and a $Ti_3O_5$ layer, and the reflectivity of the $Ti_3O_5$ layer is larger than the reflectivity of the $SiO_2$ layer; or, the two material layers 1141 and 1142 are respectively a $SiO_2$ layer and a $Ta_2O_5$ layer, and the reflectivity of the $Ta_2O_5$ layer is larger than the reflectivity of the $SiO_2$ layer, so that the light filter layer 114 can achieve the technical effect of filtering light with the wavelength of 580 nm-1100 nm, and does not affect the transmission of light used for the texture recognition.

For example, in other embodiments, the light filter layer 114 may include a stack of more material layers, such as a stack of three or four material layers, for example, the light filter layer 114 include a stacked structure of $SiO_2/Ti_3O_5/SiO_2$, a stacked structure of $SiO_2/Ti_3O_5/SiO_2/Ti_3O_5$, a stacked structure of $SiO_2/Ta_2O_5/SiO_2$, or a stack structure of $SiO_2/Ta_2O_5/SiO_2/Ta_2O_5$, etc. The embodiments of the present disclosure do not limit the specific structure of the light filter layer 114.

For example, a surface (i.e., the upper surface illustrated in the figure), away from the antistatic layer 113, of the light filter layer 114 is configured as a texture touch surface, that is, the texture of the operator can directly touch the surface, away from the antistatic layer 113, of the light filter layer 114 to be recognized. With the above-mentioned arrangement of stacked structures and materials, the surface of the light filter layer 114 has higher hardness, thus has higher scratch resistance, and can be directly used as the texture touch surface, and therefore there is no need to provide an additional texture touch component. In this case, the texture recognition device 100 is thinner and the manufacturing cost of the texture recognition device 100 can be reduced.

Figure 5A:
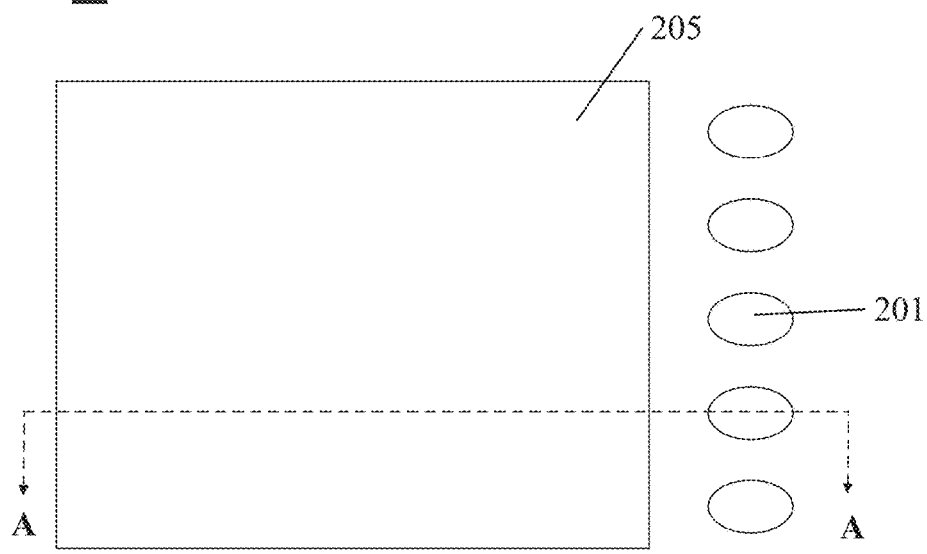
FIG. 5A is a schematic planar view of a backlight component in a texture recognition device provided by at least one embodiment of the present disclosure.
Figure 5B:
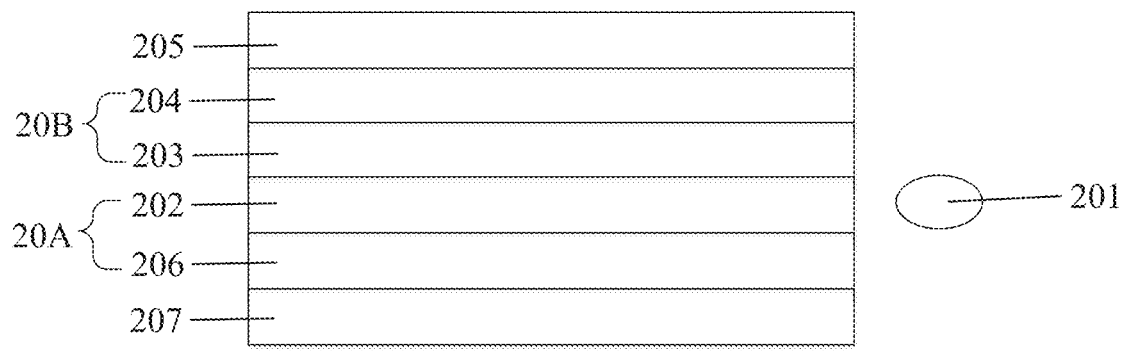
FIG. 5B is a schematic cross-sectional view of the backlight component in FIG. 5A taken along a line A-A.

For example, FIG. 5A is a schematic planar view of the backlight component 20 in the texture recognition device 100 provided by at least one embodiment of the present disclosure; and FIG. 5B is a schematic cross-sectional view of the backlight device 20 in FIG. 5A taken along a line A-A. As illustrated in FIG. 5A and FIG. 5B, the backlight component 20 includes a surface light source 20A and a light restriction layer 20B. The light restriction layer 20B is located on a side, close to the photosensitive component 10, of the surface light source 20A, and is configured to restrain light emitted from the surface light source 20A to a direction perpendicular to the surface of the texture recognition device 100 (i.e., a vertical direction in the figure).

For example, in some embodiments, as illustrated in FIG. 5B, the light restriction layer 20B includes a first prism structure 203, and the first prism structure 203 is configured to collimate the light emitted from the surface light source 20A to the direction (i.e., the vertical direction in the figure) perpendicular to the surface of the texture recognition device by refraction.

Figure 8:
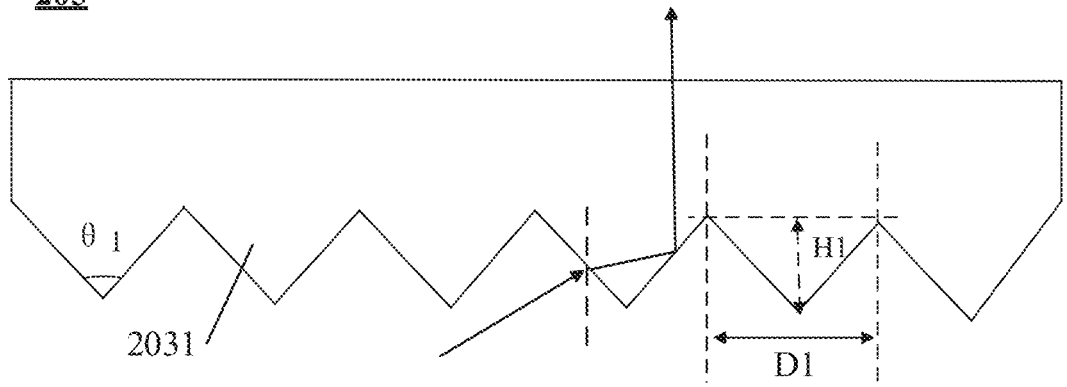
FIG. 8 is a schematic cross-sectional view of a first prism structure in a texture recognition device provided by at least one embodiment of the present disclosure.

For example, FIG. 8 shows a schematic cross-sectional view of the first prism structure 203. As illustrated in FIG. 8, one surface of the first prism structure 203 (e.g., a surface, facing the surface light source 20A, of the first prism structure 203, i.e., the lower surface illustrated in the figure) includes a plurality of prism-shaped protrusions 2031 arranged in parallel, and a main cross section of each of the prism-shaped protrusions 2031 is in a triangle shape. In this case, the prism-shaped protrusions 2031 are triangular prism-shaped protrusions, for example, an apex angle θ1 of the triangle shape is in a range of 40 degrees to 75 degrees, e.g., 50 degrees, 60 degrees or 70 degrees, a bottom edge D1 of the triangle shape is a range of 20 μm to 50 μm, e.g., 30 μm or 40 μm, and a height H1 of the triangle shape is a range of 10μ to 25 μm, e.g., 15 μm or 20 μm. As illustrated by the arrows in FIG. 8, the prism-shaped protrusions 2031 of the first prism structure 203 can refract the light emitted from the surface light source 20A to the direction perpendicular to the surface of the texture recognition device 100, thereby realizing the collimation effect on the light.

It should be noted that "main cross section" of a certain structure mentioned in the embodiments of the present disclosure refers to the cross section reflecting main design parameters of the structure. For example, for a prism-shaped structure, its main cross section is in the same shape as the shape of the bottom surface of the prism. For example, for a triangular prism, its main cross section is in a triangular shape, and for a quadrangular prism, its main cross section is in a quadrilateral shape.

For example, the surface, facing the surface light source 20A, of the first prism structure 203 includes the above-mentioned plurality of prism-shaped protrusions 2031, or, in some embodiments, a surface, away from the surface light source 20A, of the first prism structure 203 includes the above-mentioned plurality of prism-shaped protrusions 2031, which is not limited by the embodiments of the present disclosure, as long as the first prism structure 203 can refract the light emitted from the surface light source 20A to the direction perpendicular to the surface of the texture recognition device 100.

For example, in other embodiments, the first prism structure 203 may also adopt other structures. For example, the prism-shaped protrusions 2031 of the first prism structure 203 may also be quadrangular prism-shaped, pentagonal prism-shaped or be in other prism shapes, and the embodiments of the present disclosure do not limit the specific structure of the first prism structure 203, as long as the first prism structure 203 can refract the light emitted from the surface light source 20A to the direction perpendicular to the surface of the texture recognition device 100.

For example, in some embodiments, as illustrated in FIG. 5B, the light restriction layer 20B further includes a second prism structure 204 on a side, away from the surface light source 20A, of the first prism structures 203, and the second prism structure 204 is configured to only transmit light with an included angle α within 30 degrees from the normal direction of the second prism structure 204 (i.e., the vertical direction in the figure).

Figure 9:
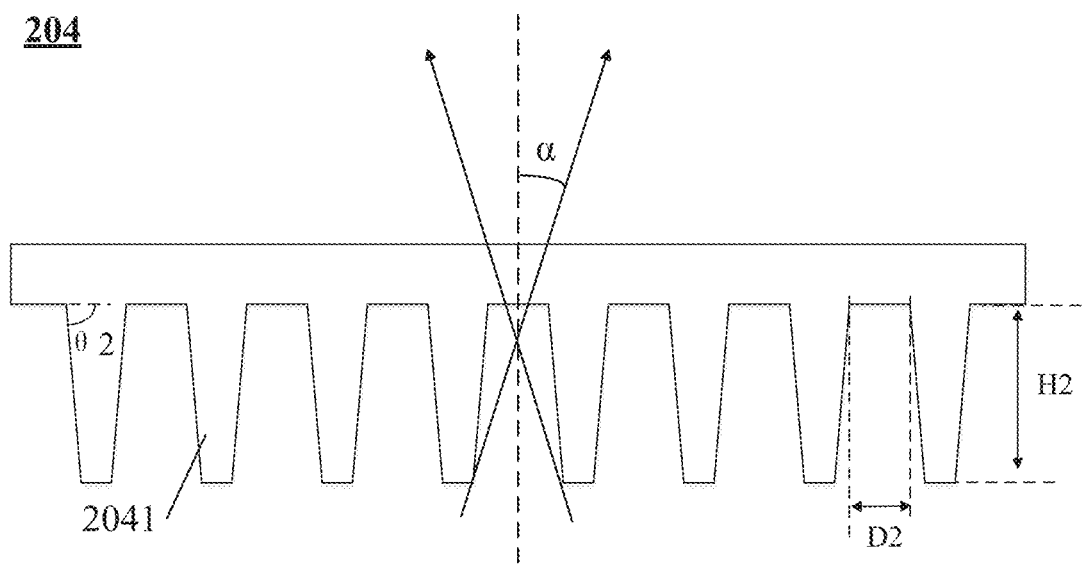
FIG. 9 is a schematic cross-sectional view of a second prism structure in a texture recognition device provided by at least one embodiment of the present disclosure.

For example, FIG. 9 shows a schematic cross-sectional view of the second prism structure 204. As illustrated in FIG. 9, one surface (illustrated as the lower surface in the figure) of the second prism structure 204 includes a plurality of prism-shaped protrusions 2041 arranged in parallel, and a main cross section of each of the prism-shaped protrusions 2041 is in a trapezium shape, such as an isosceles trapezium shape, and in this case, each of the prism-shaped protrusions 2041 is a quadrangular prism-shaped protrusion, for example, a bottom angle θ2 of the trapezium shape is in a range of 60 degrees to 90 degrees, e.g., 70 degrees or 80 degrees, and for example, a height of the trapezium shape is in a range of 300 μm to 600 μm, e.g., 400 μm or 500 μm, and a distance D2 between adjacent trapezium shapes may be in a range of 25 μm to 65 μm, e.g., 30 μm, 47 μm or 55 μm, etc. As illustrated by the arrows in FIG. 9, the second prism structure 204 can only transmit light with an included angle α within 30 degrees from a normal direction of the second prism structure 204, while light with an included angle larger than 30 degrees from the normal direction of the second prism structure 204 cannot be transmitted, so that the second prism structure 204 can further realize the collimation effect on the light.

For example, a surface, facing the surface light source 20A, of the second prism structure 204 includes the plurality of prism-shaped protrusions 2041 mentioned above, or, in some embodiments, a surface, away from the surface light source 20A, of the second prism structure 204 includes the plurality of prism-shaped protrusions 2041 mentioned above, which is not limited by the embodiments of the present disclosure, as long as the second prism structure 204 can achieve the collimation effect on the light.

For example, in some other embodiments, the second prism structure 204 may also adopt other structures. For example, the second prism structure includes a prism surface, a plurality of hollowed-out regions arranged in an array are provided in the prism surface, and a shape of each of the hollowed-out regions may be a rectangle shape (e.g., a square shape, etc.), a regular triangle shape, a regular hexagon shape or a circle shape, etc. In this case, the size of the hollowed-out region can be designed to realize that the hollowed-out region only transmits light with an included angle α within 30 degrees from the normal direction (i.e. the vertical direction in the figure) of the second prism structure 204.

For example, in some embodiments, the first prism structure 203 and the second prism structure 204 are diaphragms with prism structures formed by covering a UV (Ultra-Violet) curable resin material on a surface of a base made of a PET (Polyethylene terephthalate)-based material, and the materials of the first prism structure 203 and the second prism structure 204 are not specifically limited in the embodiments of the present disclosure.

For example, the backlight component 20 further includes an adhesive layer 205 located on a side, away from the first prism structure 203, of the second prism structure 204, and the adhesive layer 205 is used to combine the backlight component 20 with the photosensitive component 10. For example, the adhesive layer 205 may include a transparent adhesive such as an optically transparent adhesive.

For example, in some embodiments, as illustrated in FIG. 5A and FIG. 5B, the surface light source 20A includes a light guide plate 202 and at least one light emitting component 201 disposed on at least one side surface (illustrated as the right side surface in the figure) of the light guide plate 202, and light emitted by the at least one light emitting component 201 enters the light guide plate 202 from the above at least one side surface and exits from a plate surface (i.e., the upper plate surface), facing the restriction layer 20B, of the light guide plate 202, thereby forming a side-entry type backlight source.

For example, in one example, the light emitting component is a linear light source (e.g., a fluorescent lamp), and therefore one light emitting component is provided on the side surface of the light guide plate 202; for another example, the light emitting component is a point light source, and a plurality of light emitting components 201 are arranged linearly on the at least one side surface of the light guide plate 202, thus forming a linear light source located on the at least one side surface of the light guide plate 202. For example, in FIG. 5B, five light emitting components 201 linearly arranged are illustrated. In other examples, the number of the light emitting components 201 may be more, e.g., 10 or 14, etc., and the number of the light emitting components 201 can be determined according to actual conditions such as the size of the sense region 101 and the light emitting intensities of the light emitting components 201, etc.

Figure 6:
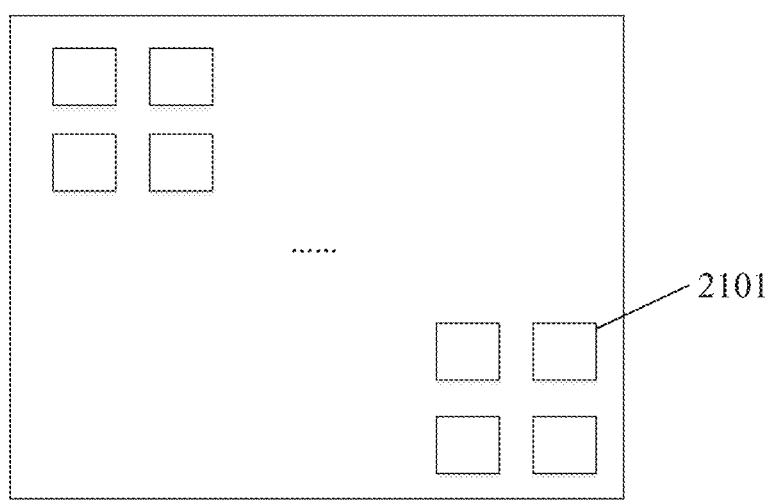
FIG. 6 is a schematic planar view of a surface light source in a texture recognition device provided by at least one embodiment of the present disclosure.

For example, in other embodiments, as illustrated in FIG. 6, the surface light source 20A may include a light emitting component array 210, that is, the combination of the light guide plate 202 and the light emitting component 201 in FIG. 5A and FIG. 5B is replaced by the light emitting component array 210. The light emitting component array 210 includes a plurality of light emitting components 2101 arranged in a plurality of rows and a plurality of columns, thereby realizing a direct type backlight source.

Both the side-entry type backlight source and the direct type backlight source can be used as the surface light source, and therefore they can be selected according to actual needs.

Figure 7:
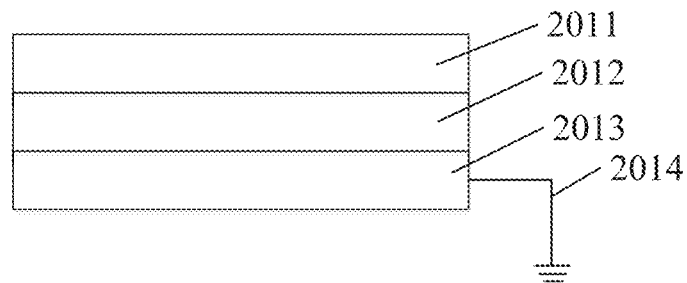
FIG. 7 is a schematic cross-sectional view of a light emitting diode in a texture recognition device provided by at least one embodiment of the present disclosure.

For example, FIG. 7 shows a schematic cross-sectional view of the light emitting component. As illustrated in FIG. 7, each light emitting component 201 or each light emitting component 2101 includes an anode 2011, a cathode 2013, a light emitting layer 2012 between the cathode 2013 and the anode 2011, and a grounded pin 2014 connected to the cathode 2013. The light emitting component 201 or the light emitting component 2101 may be a light emitting diode (LED), and a grounded pin 2014 of the light emitting diode is grounded, thereby providing a stable voltage for the cathode 2013, preventing electrostatic interference, protecting the light emitting component and improving the light emitting uniformity of the light emitting component.

For example, in some embodiments, as illustrated in FIG. 5B, the surface light source 20A further includes a reflection layer 206, and the reflection layer 206 is located on a side, away from the first prism structure 203, of the side-entry type backlight source or the direct type backlight source, that is, the reflection layer 206 is located on the lower side of the side-entry type backlight source or the direct type backlight source illustrated in FIG. 5B. The reflection layer 206 can reflect light emitted by the side-entry type backlight source or the direct type backlight source, so that the light emitted by the side-entry type backlight source or the direct type backlight source can be emitted to the first prism structure 203 as much as possible, thereby improving the utilization rate of the light source. For example, in the side-entry type backlight source, the reflection layer 206 may be a metal layer, which is formed on a surface, away from the first prism structure 203, of the light guide plate by evaporation or the like, or the reflection layer 206 may be a metal plate, which is disposed on a side, away from the first prism structure 203, of the light guide plate. For example, in the direct type backlight source, the reflection layer 206 may be a metal plate, which is disposed on a side, away from the first prism structure 203, of the light emitting components.

For example, in some embodiments, the backlight component 20 may further include a back plate 207, and the back plate 207 is disposed on a side, away from the photosensitive component 10, of the reflection layer 206. The back plate 207 can support and protect the above structures of the backlight component 20. For example, a side, away from the reflection layer 206, of the back plate 207 may be connected with the drive circuit 30 (described later) by an adhesive.

For example, in some embodiments, as illustrated in FIG. 1, the texture recognition device 100 further includes a drive circuit 30 on a side, away from the photosensitive component 10, of the backlight component 20, and the drive circuit 30 is configured to drive the photosensitive component 10, for example, to drive the photosensitive component 10 to collect and recognize textures. For example, in some embodiments, the drive circuit 30 may also be configured to drive the backlight component 30, for example, to drive the backlight component 30 to emit light, etc.

For example, the drive circuit 30 may be a field programmable gate array (FPGA), may be a microprocessor, such as an X86 processor or an ARM processor, or a digital processor (DSP), etc. The embodiments of the present disclosure do not limit the specific type of the drive circuit 30.

For example, as illustrated in FIG. 2, the texture recognition device 100 further includes a plurality of drive components arranged in the peripheral region 102, one end of each of these drive components is electrically connected to the drive circuit 30 and the other end of each of these drive components is electrically connected to the photosensitive component 10, and thus the drive circuit 30 can control the working state of the photosensitive component 10 through the drive components located in the peripheral region 102.

For example, these drive components include a plurality of readout integrated circuits (ROIC) 102, which are illustrated as six readout integrated circuits 102 in the figure, namely a first readout integrated circuit 1021, a second readout integrated circuit 1022, a third readout integrated circuit 1023, a fourth readout integrated circuit 1024, a fifth readout integrated circuit 1025 and a sixth readout integrated circuit 1026. The plurality of readout integrated circuits 102 are arranged in the peripheral region 102 and alternately distributed respectively on a first side (illustrated as the upper side of the sense region 101 in the figure) and a second side (illustrated as the lower side of the sense region 101 in the figure) of the sense region 101, and the first side is opposite to the second side.

For example, the array of the plurality of photosensitive sensors includes a plurality of sub-arrays, which are illustrated as six sub-arrays in the figure, that is, a first sub-array 1, a second sub-array 2, a third sub-array 3, a fourth sub-array 4, a fifth sub-array 5 and a sixth sub-array 6. First ends of the plurality of readout integrated circuits 102 (i.e., the ends close to the sense region 101) are respectively electrically connected to the plurality of sub-arrays, namely, the first end of the first readout integrated circuit 1021 is electrically connected to the first sub-array 1, the first end of the second readout integrated circuit 1022 is electrically connected to the second sub-array 2, the first end of the third readout integrated circuit 1023 is electrically connected to the third sub-array 3, the first end of the fourth readout integrated circuit 1024 is electrically connected to the fourth sub-array 4, the first end of the fifth readout integrated circuit 1025 is electrically connected to the fifth sub-array 5, and the first end of the sixth readout integrated circuit 1026 is electrically connected to the sixth sub-array. Second ends of the plurality of readout integrated circuits 102 (i.e., the ends away from the sense region 101) are electrically connected to the drive circuit 30. Therefore, the plurality of photosensitive sensors 112 in different regions of the sense region 101 are respectively driven by different readout integrated circuits 102 to simplify the circuit arrangement and data processing.

For example, the plurality of readout integrated circuits (ROIC) 102 may be integrated circuits arranged on a flexible film, i.e., ROIC COF (Chip on Film), so that the second ends of the readout integrated circuits 102 can be partially arranged on a back side of the texture recognition device by bending the flexible film, and then electrically connected with the drive circuit 30.

For example, a distance D between the first end of each readout integrated circuit 102 and the closest photosensitive sensor 112 electrically connected to the each readout integrated circuit 102 is larger than 5 mm, for example, larger than 5.11 mm, which is beneficial to arranging the signal lines and reducing difficulty of the manufacturing process of the texture recognition device.

For example, in other embodiments, the number of the plurality of readout integrated circuits 102 and the number of the sub-arrays of the plurality of photosensitive sensors can be selected according to actual conditions such as the size and use of the texture recognition device, which is not limited by the embodiments of the present disclosure.

For example, in some embodiments, the texture recognition device 100 may further include at least one gate driver (Gate IC) 103, which is in the peripheral region 102 and on a third side (illustrated as the left side in the figure) of the sense region 101, a first end of the at least one gate driver 103 is electrically connected with the plurality of photosensitive sensors 112, and a second end of the at least one gate driver 103 is electrically connected with the drive circuit 30.

For example, in some embodiments, as illustrated in FIG. 2, the at least one gate driver 103 includes two gate drivers 103, in this case, the texture recognition device 100 may further include a circuit board 104, the circuit board 104 is arranged between the two gate drivers 103 and the circuit board 104 is in parallel with the two gate drivers 103 on the third side of the sense region 101, and the two gate drivers 103 are electrically connected to the drive circuit 30 through the circuit board 103.

For example, the circuit board 104 may be a flexible printed circuit board (FPC), one end, close to the circuit board 104, of each of the two gate drivers 103 is electrically connected with the circuit board 104, and one end, away from the sense region 101, of the circuit board 104 is partially arranged on the back side of the texture recognition device by bending the flexible printed circuit board, and then electrically connected with the drive circuit 30.

For example, two gate drivers 103 are electrically connected to photosensitive sensors 112 located in different rows, for example, one gate driver 103 is electrically connected to the first N rows of photosensitive sensors 112, and the other gate driver 103 is electrically connected to the last M rows of photosensitive sensors 112 (both M and N are positive integers, and M+N is equal to the total row number of photosensitive sensors 112 arranged in an array), so that the plurality of photosensitive sensors 112 in different regions are respectively driven by different gate drivers 103 to simplify circuit layout and data processing.

Figure 10:
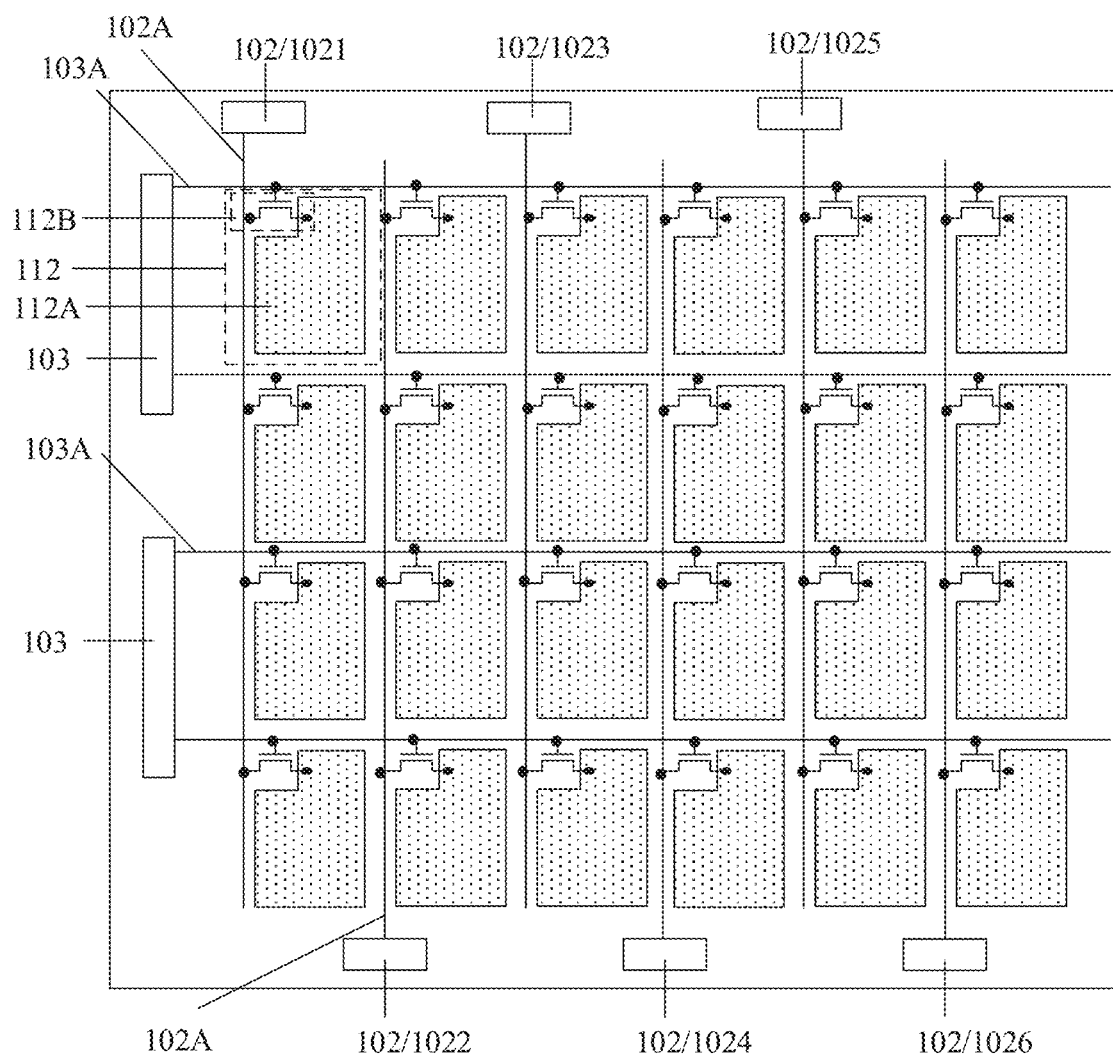
FIG. 10 is a partial circuit diagram of a texture recognition device provided by at least one embodiment of the present disclosure.

For example, FIG. 10 shows a circuit diagram of a drive circuit of a texture recognition device. In the following, combining with the circuit diagram, the drive process of the photosensitive component 10 by the drive circuit 30 and the drive component is exemplarily introduced.

For example, as illustrated in FIG. 10, each photosensitive sensor 112 of the photosensitive component 10 includes a photosensitive member 112A and a switch transistor 112B electrically connected with the photosensitive member 112A. The gate electrode of the switch transistor 112B is electrically connected to the gate driver 103 through a trace 103A, the source electrode of the switch transistor 112B is electrically connected to the photosensitive member 112A, and the drain electrode of the switch transistor 112B is electrically connected to the readout integrated circuit 102 through a trace 102A. In this way, when the trace 103A transmits a gate-on signal transmitted from the gate driver 103, the switch transistor 112B is turned on to electrically connect the photosensitive member 112A with the readout integrated circuit 102 through the trace 102A, so that the readout integrated circuit 102 can acquire an electrical signal generated by the photosensitive member 112A through photoelectric conversion and the readout integrated circuit 102 can determine the texture image according to the acquired electrical signal. When the trace 103A transmits a gate-off signal, the switch transistor 112B is turned off.

For example, the drive circuit 30 is configured to control the gate driver 103 to transmit the gate-on signal and control the readout integrated circuit 102 to recognize the texture image. In some embodiments, the drive circuit 30 is further configured to control the working state of the backlight component 10, that is, to control whether the backlight component 10 emits light or not.

For example, FIG. 10 shows photosensitive sensors 112 arranged in an array of four rows and six columns, photosensitive sensors in the first row and the second row are electrically connected with one gate driver 103 respectively through one trace 103A, and photosensitive sensors in the third row and the fourth row are electrically connected with another gate driver 103 respectively through one trace 103A. Photosensitive sensors in the first column is electrically connected to the first readout integrated circuit 1021 through a same trace 102A, photosensitive sensors in the second column are electrically connected to the second readout integrated circuit 1022 through a same trace 102A, photosensitive sensors in the third column are electrically connected to the third readout integrated circuit 1023 through a same trace 102A, photosensitive sensors in the fourth column are electrically connected to the fourth readout integrated circuit 1024 through a same trace 102A, photosensitive sensors in the fifth column are electrically connected to the fifth readout integrated circuit 1025 through a same trace 102A, and photosensitive sensors in the sixth column are electrically connected to the sixth readout integrated circuit 1026 through a same trace 102A. Therefore, the regional control and texture recognition of the plurality of photosensitive sensors 112 are realized.

For example, the photosensitive member 112A may adopt a photodiode, for example, the photodiode is a photodiode of PN type or PIN type, and the semiconductor material adopted by the photodiode may be silicon, germanium, selenium, gallium arsenide, etc. According to needs, the photosensitive member 112A can only sense light of a certain wavelength (such as blue light or green light) or sense all visible light. For example, the switch transistor 112B may be a switch component such as a thin film transistor. For example, the traces 102A and traces 103A may be metal traces including molybdenum (Mo) and/or aluminum (Al), etc.

For example, in some examples, as illustrated in FIG. 1, a stack of the photosensitive component 10, the backlight component 20, and the drive circuit 30 is encapsulated by a glue frame 60. For example, an overall size of the stack of the photosensitive component 10, the backlight component 20, and the drive circuit 30 encapsulated by the glue frame 60 is about 91.5 mm×90.2 mm. For example, the texture recognition device further includes a first housing 50 and a second housing 70 to provide protection for function structures such as the photosensitive component 10, the backlight component 20 and the drive circuit 30. For example, the first housing 50 is bonded above the photosensitive component 10 through the opaque glue frame 40, and the second housing 70 is bonded below the drive circuit 30 through the glue frame 60. For example, an overall size of the texture recognition device combined with the first housing 50 and the second housing 70 is about 92.1 mm×90.9 mm and the thickness of the texture recognition device combined with the first housing 50 and the second housing 70 is about 3 mm-7 mm, such as 4 mm or 5 mm.

The texture recognition device provided by at least one embodiment of the present disclosure includes the antistatic layer arranged above the photosensitive component, so that static electricity generated when the operator touches the texture recognition device can be prevented from interfering with the photosensitive component. In addition, in at least one embodiment, the texture recognition device further includes the light filter layer arranged above the antistatic layer, so that the ambient light can be filtered to avoid interference caused by the ambient light on the photosensitive component. In addition, in at least one embodiment, the backlight component of the texture recognition device includes the first prism structure and the second prism structure, both of the first prism structure and the second prism structure can adjust the light emitted by the backlight source, so that the light emitted by the backlight component has better collimation and uniformity. Therefore, the texture recognition device as a whole provided by at least one embodiment of the present disclosure has a better accuracy of texture recognition, and can be used for large-area texture recognition.

At least one embodiment of the present disclosure further provides a manufacturing method of a texture recognition device, and the manufacturing method includes: providing a backlight component; providing a photosensitive component; and stacking the backlight component and the photosensitive component. The photosensitive component is configured to detect light emitted by the backlight component and reflected by a texture of a detection object to recognize an image of the texture of the detection object. The photosensitive component includes a plurality of photosensitive sensors and an antistatic layer on a side, away from the backlight component, of the plurality of photosensitive sensors, and orthographic projections of the plurality of photosensitive sensors on a plane where the antistatic layer is located are within the antistatic layer.

For example, in some embodiments, each component of the backlight component and the photosensitive component may be commercially available, and then the backlight component and the photosensitive component are assembled according to the arrangement of FIG. 1.

For example, in some embodiments, the photosensitive component may also be self-made, and in this case, referring to FIG. 3, providing the photosensitive component may include: forming the plurality of photosensitive sensors on a substrate 111, and then forming the antistatic layer on the plurality of photosensitive sensors by a coating method.

For example, in an example, the substrate 111 may be a transparent substrate with a thickness of about 0.7 mm, e.g., a glass substrate. For example, forming the plurality of photosensitive sensors includes forming a photosensitive member of each photosensitive sensor and a switch transistor of each photosensitive sensor. The photosensitive member may be a photodiode, such as a photodiode of PN type or PIN type; the switch transistor may be a thin film transistor. In this case, forming the plurality of photosensitive sensors 112 includes sequentially forming function layers of the thin film transistors and the photodiodes on the substrate 111 by patterning processes. The specific forming process can be referred to related technologies and are not be described in detail here.

For example, after the plurality of photosensitive sensors 112 are formed, the antistatic layer 113 may be formed on the plurality of photosensitive sensors by a coating method or the like. For example, in an example, the antistatic layer 113 includes an epoxy resin material, and in the manufacturing process, the epoxy resin material may be coated on the entire surface of the substrate to form an integral film over the plurality of photosensitive sensors as the antistatic layer 113. The antistatic layer 113 can fully realize the antistatic effect.

For example, after the antistatic layer 113 is formed, a light filter layer 114 is formed on a side, away from the plurality of photosensitive sensors 112, of the antistatic layer 113 by an evaporation method or the like, and the light filter layer 114 is configured to filter light with a wavelength in a predetermined range.

For example, the light filter layer 114 includes a stack of a plurality of material layers, and therefore in the manufacturing process, the plurality of material layers may be sequentially evaporated on the antistatic layer 113. For example, referring to FIG. 4, in an example, the light filter layer 114 includes a stack of two material layers 1141 and 1142. For example, the two material layers 1141 and 1142 are respectively the $SiO_2$ layer and the $Ti_3O_5$ layer; or, the two material layers 1141 and 1142 are respectively the $SiO_2$ layer and the $Ta_2O_5$ layer. In this case, the $SiO_2$ layer and the $Ti_3O_5$ layer may be sequentially evaporated on the antistatic layer 113 to form the stack of the $SiO_2$ layer and the $Ti_3O_5$ layer; or, the $SiO_2$ layer and the $Ta_2O_5$ layer are sequentially evaporated on the antistatic layer 113, thereby forming the stack of the SiO₂ layer and the Ta₂O₅ layer.

For example, in some embodiments, the manufacturing method of the texture recognition device further includes providing a drive circuit and connecting the drive circuit on a side, away from the photosensitive component, of the backlight component. For example, in an example, the drive circuit provided may be a field programmable gate array (FPGA). The photosensitive component and the backlight component may be respectively electrically connected with the drive circuit, and the electrical connection mode can be referred to the above embodiment, so as to form the texture recognition device as illustrated in FIG. 1.

For example, the drive circuit may be designed and commissioned to be manufactured by a factory, or can be self-made, and the embodiments of the present disclosure do not limit the acquisition mode of the drive circuit.

For example, after the photosensitive component is prepared, the opaque glue frame (such as the black glue frame) may further be coated around the sense region of the photosensitive component; after the photosensitive component, the backlight component and the drive circuit are assembled, the stacked structure of the photosensitive component, the backlight component and the drive circuit may further be encapsulated with a glue frame (e.g., the glue frame 60), and housings (e.g., the first housing 50 and the second housing 70) are installed to protect the stacked structure, referring to FIG. 1. The embodiments of the present disclosure do not specifically limit other manufacturing processes of the texture recognition device.

The Following Statements should be Noted:

(1) The accompanying drawings involve only the structure(s) in connection with the embodiment(s) of the present disclosure, and other structure(s) can be referred to common design(s).

(2) For the purpose of clarity only, in accompanying drawings for illustrating the embodiment(s) of the present disclosure, the thickness and size of a layer or a structure may be enlarged or narrowed, that is, the drawings are not drawn in a real scale. However, it should understood that, in the case in which a component such as a layer, film, region, substrate or the like is referred to be "on" or "under" another component, the component may be directly on or under the another component or there may be an intermediate component.

(3) In case of no conflict, the embodiments of the present disclosure and the features in the embodiments can be combined with each other to obtain new embodiments.

What have been described above are only specific implementations of the present disclosure, the protection scope of the present disclosure is not limited thereto, and the protection scope of the present disclosure should be based on the protection scope of the claims.

What is claimed is:

1. A texture recognition device, comprising:
a backlight component; and
a photosensitive component, which is on a light-outputting side of the backlight component and configured to detect light emitted by the backlight component and reflected by a texture of a detection object to recognize an image of the texture of the detection object,
wherein the photosensitive component comprises a plurality of photosensitive sensors and an antistatic layer on a side, away from the backlight component, of the plurality of photosensitive sensors, and orthographic projections of the plurality of photosensitive sensors on a plane where the antistatic layer is located are within the antistatic layer,
wherein the backlight component comprises a surface light source and a light restriction layer,
the light restriction layer is on a side, close to the photosensitive component, of the surface light source, and is configured to restrain light emitted from the surface light source to a direction perpendicular to a surface of the texture recognition device.

2. The texture recognition device according to claim 1, wherein a thickness of the antistatic layer is in a range of 8 microns to 30 microns.

3. The texture recognition device according to claim 1, wherein a relative dielectric constant of the antistatic layer is in a range of 3 to 10; and a material of the antistatic layer comprises a resin material.

4. The texture recognition device according to claim 1, wherein the photosensitive component further comprises a light filter layer on a side of the antistatic layer, the side where the light filter layer is located is away from the plurality of photosensitive sensors, and the light filter layer is configured to filter light with a wavelength of 580 nm to 1100 nm.

5. The texture recognition device according to claim 4, wherein a material of the light filter layer comprises a stack of at least one SiO₂ layer and at least one Ti₃O₅ layer or a stack of at least one SiO₂ layer and at least one Ta₂O₅ layer.

6. The texture recognition device according to claim 4, wherein a surface of the light filter layer is configured as a texture touch surface, and the surface configured as the texture touch surface is away from the antistatic layer.

7. The texture recognition device according to claim 1, wherein the light restriction layer comprises a first prism structure, and
the first prism structure is configured to collimate the light emitted from the surface light source to the direction perpendicular to the surface of the texture recognition device by refraction.

8. The texture recognition device according to claim 7, wherein one surface of the first prism structure comprises a plurality of prism-shaped protrusions that are in parallel, a main cross section of each of the prism-shaped protrusions is in a triangle shape, and an apex angle of the triangle shape is in a range of 40 degrees to 75 degrees.

9. The texture recognition device according to claim 7, wherein the light restriction layer further comprises a second prism structure on a side, away from the surface light source, of the first prism structure, and
the second prism structure is configured to only transmit light with an included angle within 30 degrees from a normal direction of the second prism structure.

10. The texture recognition device according to claim 9, wherein one surface of the second prism structure comprises a plurality of prism-shaped protrusions that are in parallel, a main cross section of each of the prism-shaped protrusions of the second prism structure is in a trapezium shape, and a bottom angle of the trapezium shape is in a range of 60 degrees to 90 degrees.

11. The texture recognition device according to claim 1, wherein the surface light source comprises a light guide plate and at least one light emitting component on at least one side surface of the light guide plate, and light emitted by the at least one light emitting component enters the light guide plate from the at least one side surface and exits from a plate surface, facing the light restriction layer, of the light guide plate; or, the surface light source comprises a light emitting component array, and light emitting component array comprises a plurality of light emitting components that are in a plurality of rows and a plurality of columns.

12. The texture recognition device according to claim 11, wherein each of the light emitting components comprises a cathode, an anode, a light emitting layer between the cathode and the anode, and a grounded pin connected to the cathode.

13. The texture recognition device according to claim 1, further comprising: a drive circuit on a side, away from the photosensitive component, of the backlight component, wherein the drive circuit is configured to drive the photosensitive component.

14. The texture recognition device according to claim 13, wherein the photosensitive component comprises a sense region and a peripheral region surrounding the sense region, and the plurality of photosensitive sensors are in an array in the sense region, the texture recognition device further comprises a plurality of readout integrated circuits, the plurality of readout integrated circuits are in the peripheral region and alternately distributed respectively on a first side of the sense region and a second side of the sense region, and the first side is opposite to the second side;

the array of the plurality of photosensitive sensors comprises a plurality of sub-arrays, first ends of the plurality of readout integrated circuits are respectively electrically connected with the plurality of sub-arrays, and second ends of the plurality of readout integrated circuits are electrically connected with the drive circuit.

15. The texture recognition device according to claim 14, further comprising: at least one gate driver which is in the peripheral region and on a third side of the sense region, wherein a first end of the at least one gate driver is electrically connected with the plurality of photosensitive sensors, and a second end of the at least one gate driver is electrically connected with the drive circuit.

16. The texture recognition device according to claim 15, further comprising a circuit board, wherein the at least one gate driver comprises two gate drivers, the circuit board is between the two gate drivers and in parallel with the two gate drivers on the third side, and the two gate drivers are electrically connected with the drive circuit through the circuit board.

17. The texture recognition device according to claim 14, further comprising: an opaque glue frame surrounding the sense region.

18. A manufacturing method of a texture recognition device, comprising:

providing a backlight component;

providing a photosensitive component which is configured to detect light emitted by the backlight component and reflected by a texture of a detection object to recognize an image of the texture of the detection object, wherein the photosensitive component comprises a plurality of photosensitive sensors and an antistatic layer on a side, away from the backlight component, of the plurality of photosensitive sensors, and orthographic projections of the plurality of photosensitive sensors on a plane where the antistatic layer is located are within the antistatic layer; and stacking the backlight component and the photosensitive component, wherein the backlight component comprises a surface light source and a light restriction layer, the light restriction layer is on a side, close to the photosensitive component, of the surface light source, and is configured to restrain light emitted from the surface light source to a direction perpendicular to a surface of the texture recognition device.

19. The manufacturing method of the texture recognition device according to claim 18, wherein providing the photosensitive component comprises:

forming the plurality of photosensitive sensors on a substrate, and forming the antistatic layer on the plurality of photosensitive sensors by a coating method; and forming a light filter layer on a side of the antistatic layer by an evaporation method, and the side where the light filter layer is located is away from the plurality of photosensitive sensors, wherein the light filter layer is configured to filter light with a wavelength in a predetermined range.

* * * * *

UNITED STATES PATENT AND TRADEMARK OFFICE
CERTIFICATE OF CORRECTION

PATENT NO. : 11,908,226 B2
APPLICATION NO. : 16/970091
DATED : February 20, 2024
INVENTOR(S) : Yajie Feng et al.

Page 1 of 1

It is certified that error appears in the above-identified patent and that said Letters Patent is hereby corrected as shown below:

On the Title Page

Column 1, Item (30) the following priority information should be inserted:
-- (30) Foreign Application Priority Data
September 04, 2019 (CN) .................. PCT/CN2019/104349 --.

Signed and Sealed this
Ninth Day of April, 2024

Katherine Kelly Vidal
*Director of the United States Patent and Trademark Office*